(12) United States Patent
Yoon et al.

(10) Patent No.: US 8,815,697 B2
(45) Date of Patent: Aug. 26, 2014

(54) METHOD OF FABRICATING SEMICONDUCTOR DEVICE

(75) Inventors: Jun-Ho Yoon, Suwon-si (KR); Bong-Jin Kuh, Suwon-si (KR); Ki-Chul Kim, Seongnam-si (KR); Gyung-Jin Min, Seongnam-si (KR); Tae-Jin Park, Suwon-si (KR); Sang-Ryol Yang, Suwon-si (KR); Jung-Min Oh, Incheon (KR); Sang-Yoon Woo, Gwangmyeong-si (KR); Young-Sub Yoo, Suwon-si (KR); Ji-Eun Lee, Ansan-si (KR); Jong-Sung Lim, Seoul (KR); Yong-Moon Jang, Incheon (KR); Han-Mei Choi, Seoul (KR); Je-Woo Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/478,450

(22) Filed: May 23, 2012

(65) Prior Publication Data

US 2013/0005110 A1      Jan. 3, 2013

(30) Foreign Application Priority Data

Jun. 30, 2011   (KR) .................. 10-2011-0064867

(51) Int. Cl.
  *H01L 21/3213*  (2006.01)
  *H01L 27/108*   (2006.01)
  *H01L 21/285*   (2006.01)

(52) U.S. Cl.
  USPC ....................................... 438/396

(58) Field of Classification Search
  CPC ......... H01L 28/10; H01L 28/40; H01L 28/56; H01L 28/57; H01L 23/5227; H01L 29/66181
  USPC ................... 438/381, 239, 386; 257/E21.008
  See application file for complete search history.

(56) References Cited

U.S. PATENT DOCUMENTS

| 7,858,486 | B2 |   | 12/2010 | Manning |           |
|-----------|----|---|---------|---------|-----------|
| 2003/0190782 | A1 | * | 10/2003 | Ko et al. ........................ | 438/240 |
| 2006/0063324 | A1 | * | 3/2006 | Park et al. ..................... | 438/239 |
| 2006/0211178 | A1 | * | 9/2006 | Kim et al. ..................... | 438/129 |
| 2007/0117335 | A1 | * | 5/2007 | Sandhu et al. ................ | 438/306 |
| 2007/0196978 | A1 | * | 8/2007 | Manning ....................... | 438/244 |
| 2008/0003741 | A1 | * | 1/2008 | Park et al. ..................... | 438/238 |
| 2010/0330772 | A1 | * | 12/2010 | Rui et al. ....................... | 438/396 |
| 2011/0045657 | A1 | * | 2/2011 | Kim et al. ..................... | 438/476 |
| 2012/0115293 | A1 | * | 5/2012 | Noh et al. ..................... | 438/239 |

FOREIGN PATENT DOCUMENTS

JP   2011061067   3/2011
KR   1020100093925   8/2010

* cited by examiner

*Primary Examiner* — Olik Chaudhuri
*Assistant Examiner* — Christine Enad
(74) *Attorney, Agent, or Firm* — Myers Bigel Sibley & Sajovec, P.A.

(57) ABSTRACT

Provided is a method of manufacturing a semiconductor device having a capacitor. The method includes forming a composite layer, including sequentially stacking on a substrate alternating layers of first through nth sacrificial layers and first through nth supporting layers. A plurality of openings that penetrate the composite layer are formed. A lower electrode is formed in the plurality of openings. At least portions of the first through nth sacrificial layers are removed to define a support structure for the lower electrode extending between adjacent ones of the plurality of openings and the lower electrode formed therein, the support structure including the first through nth supporting layers and a gap region between adjacent ones of the first through nth supporting layers where the first through nth sacrificial layers have been removed. A dielectric layer is formed on the lower electrode and an upper electrode is formed on the dielectric layer.

19 Claims, 25 Drawing Sheets

METHOD OF FABRICATING SEMICONDUCTOR DEVICE

CROSS-REFERENCE TO RELATED APPLICATION

This application claims priority from Korean Patent Application No. 10-2011-0064867 filed on Jun. 30, 2011 in the Korean Intellectual Property Office, and all the benefits accruing therefrom under 35 U.S.C. 119, the contents of which in its entirety are herein incorporated by reference.

BACKGROUND

The present invention relates to a method of fabricating a semiconductor device, and more particularly, to a method of manufacturing a semiconductor device having a capacitor.

As the integration density of a semiconductor device increases, different methods for forming capacitors using various structures or materials have been developed to increase capacitance. For example, to address increasing demands for enhanced capacitance capacitors, cylindrical or pillar capacitors have been proposed.

Due to growing demands for higher density, smaller dimension semiconductor devices, aspect ratios tend to increase. Thus, when an opening for forming a capacitor is formed, it may be difficult to deliver sufficient energy to a bottom of an etched surface. As such, a width may decrease toward the lower portion of the opening. Furthermore, when the lower width of the opening is increased so as to provide a sufficient contact area with a bottom plug, an upper width of the opening will also generally increase, which may cause a short circuit between adjacent gates.

SUMMARY

Some embodiments of the present invention provide a method of manufacturing a semiconductor device having a capacitor. The method includes forming a composite layer, including sequentially stacking on a substrate alternating layers of first through nth sacrificial layers and first through nth supporting layers. A plurality of openings that penetrate the composite layer are formed. A lower electrode is formed in the plurality of openings. At least portions of the first through nth sacrificial layers are removed to define a support structure for the lower electrode extending between adjacent ones of the plurality of openings and the lower electrode formed therein, the support structure including the first through nth supporting layers and a gap region between adjacent ones of the first through nth supporting layers where the first through nth sacrificial layers have been removed. A dielectric layer is formed on the lower electrode and an upper electrode is formed on the dielectric layer.

In other embodiments, the first through nth sacrificial layers include a silicon (Si)-based material including Si—Si bonds having a low bonding energy relative to a material of the first through nth supporting layers and include a conductive material that reduces a charge effect during removing of the at least portions of the first through nth sacrificial layers. The first through nth sacrificial layers may include at least one of crystalline silicon, polysilicon, amorphous silicon, and silicon germanium. The first through nth supporting layers may include an insulating material. The first through nth supporting layers may include at least one of a silicon nitride layer, a silicon oxide layer, or a silicon oxynitride layer.

In further embodiments, forming a composite layer includes forming one of the sacrificial layers and performing a hydrogen treatment on the formed one of the sacrificial layers that limits subsequent formation of a native oxide layer thereon. An adjacent one of the support layers is formed on the hydrogen treated sacrificial layer. These operations are repeated to provide the first through nth sacrificial layers and first through nth supporting layers.

In other embodiments, forming the lower electrode is preceded by forming a silicide prevention layer along an inner wall of each of the plurality of openings. The silicide prevention layer may include titanium oxide ($Ti_xO_y$).

In yet other embodiments, removing at least portions of the first through nth sacrificial layers includes removing a portion of a kth supporting layer, where k is a natural number descending sequentially from n to 1, to expose a portion of the kth sacrificial layer. The kth sacrificial layer is substantially completely removed through the exposed portion of the kth sacrificial layer. A plurality of supports of the support structure for supporting the lower electrode are formed by repeatedly performing the removing of the portion of the kth supporting layer and the substantially completely removing of the kth sacrificial layer at least twice. Forming of the composite layer may include forming the nth supporting layer to be thicker than any one of the first through (n−1)th supporting layers.

In other embodiments, the forming of the plurality of openings includes forming a first mask pattern on the nth supporting layer and selectively etching the composite layer using the first mask pattern as an etch mask. Removing of the portions of the first through nth supporting layers and the whole of the first through nth sacrificial layers includes forming a second mask pattern on the first mask pattern and the lower electrode that exposes a portion of the first mask pattern, removing the exposed portion of the first mask pattern and the nth supporting layer using the second mask pattern as an etch mask and exposing a portion of the nth sacrificial layer, removing the second mask pattern, wet etching to device to substantially completely remove the nth sacrificial layer, exposing a portion of the (n−1)th sacrificial layer by removing the (n−1)th supporting layer using the first mask pattern as an etch mask and removing a portion of the first mask pattern together with the (n−1)th supporting layer and wet etching the device to substantially completely remove the (n−1)th sacrificial layer.

In further embodiments, forming the lower electrode includes conformally forming a lower electrode material in the plurality of openings to define a lower electrode of a cylindrical capacitor.

In other embodiments, forming the plurality of openings includes forming the plurality of openings concurrently in a same operation. Forming of the plurality of openings concurrently may include forming a mask pattern on the composite layer and etching the composite layer using the mask pattern as an etch mask to form the plurality of openings. Removing at least portions of the first through nth sacrificial layers may include removing the mask pattern and then wet etching the device to substantially completely remove the first through nth sacrificial layers using an etching solution with a high selectivity of the of the sacrificial layers relative to the support layers. Removing at least portions of the first through nth sacrificial layers may include removing a portion of the first through nth supporting layers.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE EMBODIMENTS

Figure 1:
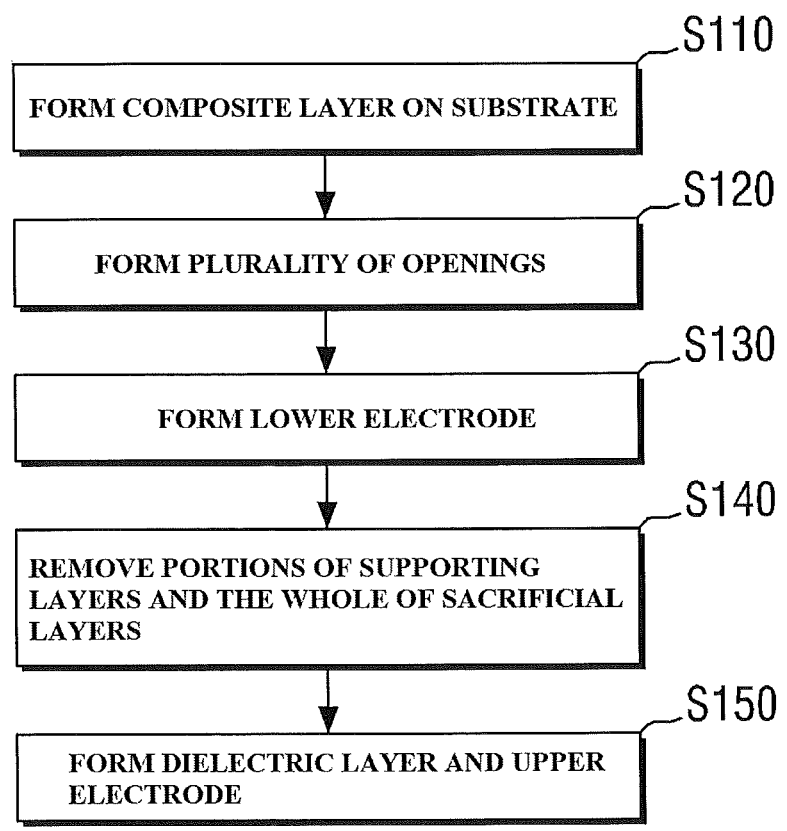
FIG. 1 is a flowchart illustrating a method of manufacturing a semiconductor device according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method of manufacturing a semiconductor device according to embodiments of the present invention will be described with reference to FIGS. 1 through 14. FIG. 1 is a flowchart of a method of manufacturing a semiconductor device according to some embodiments. FIGS. 2 through 14 are cross-sectional views of intermediate structures illustrating the method of manufacturing a semiconductor device shown in FIG. 1 according to some embodiments.

Figure 2:
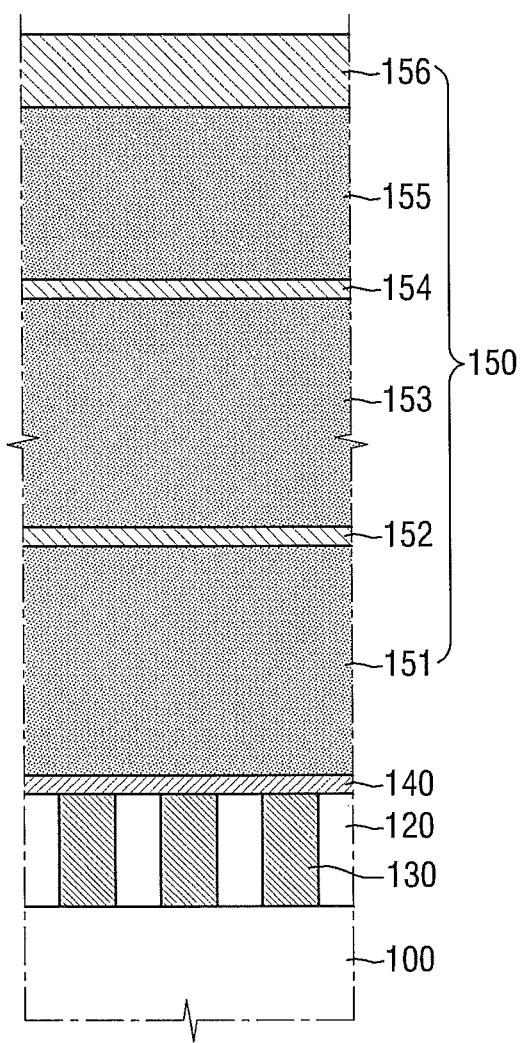
FIGS. 2 through 14 are cross-sectional views of intermediate structures illustrating the method of manufacturing a semiconductor device of FIG. 1 according to some embodiments of the present invention.

Referring to FIGS. 1 and 2, a composite layer 150 is formed on a substrate 100 (S110). The composite layer includes first through nth sacrificial layers 151, 153, and 155 and first through nth supporting layers 152, 154, and 156. These layers are sequentially stacked, alternating between sacrificial and supporting layers.

The substrate 100 may include, for example, a semiconductor substrate made of at least one material selected from the group consisting of Silicon (Si), Germanium (Ge), Silicon Germanium (SiGe), Gallium Phosphorous (GaP), Gallium Arsenic (GaAs), Silicon Carbide (SiC), Silicon Germanium Carbide (SiGeC), Indium Arsenic (InAs) and Indium Phosphorous (InP), and a silicon on insulator (SOI) substrate, but is not limited thereto. In addition, as shown in FIG. 2, an interlayer dielectric film 120 having a contact plug 130 may be formed on the substrate 100. Although not shown, various active elements, passive elements, or wirings may be formed under the contact plug 130.

As shown in FIG. 2, an etch stop layer 140 is formed on the interlayer dielectric film 120. The forming of the etch stop layer 140 may be performed by chemical vapor deposition (CVD) or physical vapor deposition (PVD). The etch stop layer 140 may be formed of, for example, a nitride layer, an oxide layer, an oxynitride layer, or a silicon carbide (SiC).

The composite layer 150 is formed by sequentially stacking the first sacrificial layer 151 and the first supporting layer 152 and then repeatedly sequentially stacking the second through nth sacrificial layers 153 and 155 and the second through nth supporting layers 154 and 156 in the same manner. In other words, the first sacrificial layer 151, the first supporting layer 152, the second sacrificial layer 153, the second supporting layer 154, the nth sacrificial layer 155, and the nth supporting layer 156 are sequentially formed. In this way, the composite layer 150 may be formed by sequentially stacking alternating layers of the first through nth sacrificial layers 151, 153, and 155 and the first through nth supporting layers 152, 154, and 156.

The first through nth sacrificial layers 151, 153, and 155 may include a silicon-based material. For example, the first through nth sacrificial layers 151, 153, and 155 may comprise at least one of crystalline silicon, polysilicon, amorphous silicon, and silicon germanium (SiGe). The silicon-based material includes many Si—Si bonds having relatively low bonding energy. Thus, relatively low energy may be used in a subsequent etching process, e.g., a dry etching process, of the sacrificial layers 151, 153, and 155.

The sacrificial layers 151, 153, and 155 may also include a conductive material. The conductive material may reduce a charging effect that may occur when a layer to be etched has a large aspect ratio. Thus, when an opening having a large aspect ratio is formed, energy can be more easily delivered to a bottom surface of the opening. In this case, the bottom surface may be made wider, which means a side wall of the opening may be approximately perpendicular to the bottom surface. In other words, the bottom surface may have an area approximately equal to an area of a lower surface of the opening. Thus, a contact area between a capacitor electrode and a contact plug 130 may be increased, thereby enhancing capacitance characteristics.

In other words, the sacrificial layers 151, 153, and 155 may include a silicon-based conductive material. The supporting layers 152, 154, and 156 may include an insulating material. The supporting layers 152, 154, and 156 may be formed of, for example, a silicon nitride layer, a silicon oxide layer, or a silicon oxynitride layer.

Furthermore, after forming each of the first through nth sacrificial layers 151, 153, and 155, a hydrogen treatment may be performed before forming the respective first through nth supporting layers 151, 153, and 155 in order to limit or even prevent formation of a native oxide layer on the first through nth sacrificial layers 151, 153, and 155. In other words, hydrogen bonds are formed on the first through nth sacrificial layers 151, 153, and 155 so as to suppress the formation of native oxide, and the first through nth supporting layers 152, 154, and 156 are formed on the hydrogen treated first through nth sacrificial layers 151, 153, and 155, respectively. For example, the first sacrificial layer 151 may be formed and subjected to hydrogen treatment, followed by formation of the first supporting layer 152. Thereafter, the second sacrificial layer 153 may be formed on the first supporting layer 152 and subjected to the hydrogen treatment, and the second supporting layer may be formed on the second supporting layer 154. Such a process may be repeatedly performed to form the composite layer 150. Depending on the application, the hydrogen treatment may be performed on each of the first through nth sacrificial layers 151, 153, and 155 or be selectively performed on an lth sacrificial layer (l is a natural number from 1 through n). In other words, the hydrogen treatment is performed on at least one of the first through nth sacrificial layers.

The sacrificial layers 151, 153, and 155 and the first through nth supporting layers 152, 154, and 156 may be deposited by chemical vapor deposition (CVD) or physical vapor deposition (PVD). In this case, considering a stress such as a tensile force or stress that can be applied to the substrate when the sacrificial layers 151, 153, and 155 are deposited on one surface of the substrate 100, a predetermined treatment may be performed on the substrate 100. For example, in order to compensate for the stress that is applied to the substrate 100 by the sacrificial layers 151, 153, and 155 deposited on the one surface of the substrate 100, the same material as the sacrificial layers 151, 153, and 155 may be deposited on a rear surface of the substrate 100. Various other methods may be used to alleviate the stress applied to the substrate 100.

In addition, as shown in FIG. 2, the nth supporting layer 156 that is the uppermost one of the first through nth supporting layers 152, 154, and 156 may be thicker than any one of the first through (n−1)th supporting layers 152 and 154. For example, the nth supporting layer 156 may have a thickness that is more than twice the thickness of one of the first through (n−1)th supporting layers 152 and 154. Specifically, the nth supporting layer 156 may have a thickness that is about 1.5 times to 6 times the thickness of one of the first through (n−1)th supporting layers 152 and 154. Thus, the nth supporting layer 156 may be used as an etch mask during subsequent etching to etch portions of the first through (n—a)th supporting layers 152 and 154 (a is a natural number from 1 through n−1), which will be described in more detail below.

Although the illustrated composite layer 150 consists of three sacrificial layers 151, 153, and 155 and three supporting layers 152, 154, and 156, it is not limited thereto. For example, the number of the sacrificial layers and supporting layers may be 2 or greater than 3. Hereinafter, the first through nth sacrificial layers 151, 153, and 155 and the first through nth supporting layers 152, 154, and 156 are described as an example for brevity of explanation. Furthermore, while the nth supporting layer 156 is the uppermost one in the composite layer 150 in FIG. 2, alternatively, the nth sacrificial layer 155 may be the uppermost layer.

Figure 3:
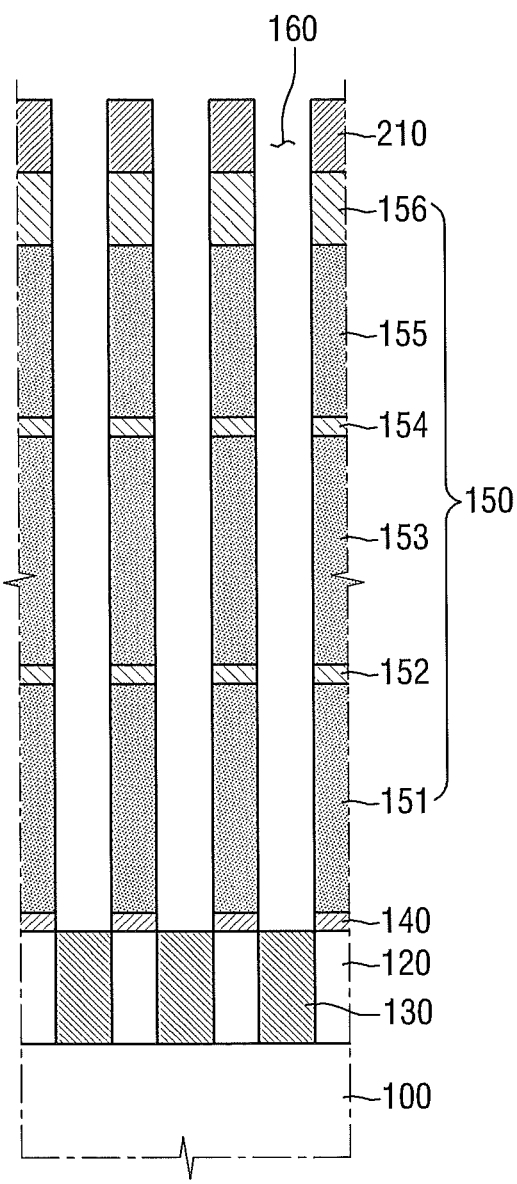

Referring to FIGS. 1 and 3, a plurality of openings 160 are formed so as to penetrate the composite layer 150 (S120).

More specifically, a first mask pattern 210 is formed on the nth (e.g., third) supporting layer 156 and used as an etch mask to selectively etch the composite layer 150. In other words, the third supporting layer 156, the third sacrificial layer 155, the second supporting layer 154, the second sacrificial layer 153, the first supporting layer 152, and the first sacrificial layer 151 are sequentially etched using the first mask pattern 210 as an etch mask. As described above, as the sacrificial layers 151, 153, and 155 are made of a different material from the supporting layers 152, 154, and 156, etching may be performed under different etching conditions.

For example, the supporting layers 152, 154, and 156 may be etched using a first etching gas while the sacrificial layers 151, 153, and 155 are etched using a second etching gas. In this case, the first and second etching gases have different compositions. For example, the etching may be performed under different process conditions such as etching temperature and process time. Furthermore, etching of the supporting layers 152, 154, and 156 and the sacrificial layers 151, 153, and 155 may be performed in-situ.

As shown in FIG. 3, the plurality of openings 160 penetrate the composite layer 150 and the etch stop layer 140 so as to expose the underlying contact plug 130. In this case, the plurality of openings 160 may have a vertical hole pattern. As described above, as the sacrificial layers 151, 153, and 155 contain a material having a low bonding energy, such as a silicon-based conductive material, they may be etched at low energy. Because the sacrificial layers 151, 153, and 155 have conductivity, a charging effect may be reduced, and a vertical profile can be easily implemented.

Furthermore, an oxide layer may be formed along sidewalls of the sacrificial layers 151, 153, and 155 during etching. The oxide layer formed along sidewalls of the sacrificial layers 151, 153, and 155 may be, for example, a silicon oxide layer. Due to passivation of the sidewalls of the sacrificial layers 151, 153, and 155 by the oxide layer, bowing of the openings 160 may be limited or even prevented. In other words, the plurality of openings 160 may have an excellent vertical profile. By etching the composite layer 150 formed from a stack of alternate layers of the first through nth supporting layers 152, 154, and 156 in a stepwise manner, the plurality of openings 160 may have a more excellent vertical profile than when the plurality of openings 160 are formed by etching a single layer having the same thickness as the composite layer 150.

In some embodiments, the third supporting layer 156 may be etched during etching to form the first mask pattern 210. For example, when the third supporting layer 156 and the first mask pattern 210 include materials based on the same material, the third supporting layer 156 may also be etched during patterning of the first mask pattern 210.

Next, the third sacrificial layer 155 may be etched using the first mask pattern 210 and the third supporting layer 156 as etch masks. For example, a fluorine-based gas, a boron-based gas, $O_2$, or an inert gas may be used as an etching gas. In addition, in order to improve selectivity of the third sacrificial layer 155 with respect to the first mask pattern 210 and the third supporting layer 156, SiF or $SiCl_4$ gas may be added. This etching process may be applied to not only the third sacrificial layer 155 but also the second sacrificial layer 153 and the first sacrificial layer 151.

Subsequently, the second supporting layer 154 may be etched using the first mask pattern 210, the third supporting layer 156, and the third sacrificial layer 155 as etch masks. For example, a hydrogen containing gas, such as $CH_2F_2$, $CH_3F$, $CHF_3$, or $CH_4$, may be used as an etching gas. In addition, a fluorocarbon-based gas, $O_2$, or an inert gas may be used as an etching gas. This etching process may also be applied to the first supporting layer 152.

Furthermore, after etching the third sacrificial layer 155, an $O_2$ plasma process or ozone treatment may be performed to passivate an inner wall of the third sacrificial layer 155 before etching the second sacrificial layer 153. As described above, an oxide layer may be formed on a sidewall of the third sacrificial layer 155 during etching. In order to more stably passivate the inner wall of the third sacrificial layer 155, the process of oxidizing the exposed sacrificial layer 155 may also be performed. Thus, when the second sacrificial layer 153 is etched, expansion or bowing of the preformed openings 160 can be more effectively limited or even prevented.

After forming the plurality of openings 160 penetrating the composite layer 150, i.e., after completing etching of up to the first sacrificial layer 151, cleaning may be performed to remove a passivation layer.

Figure 4:
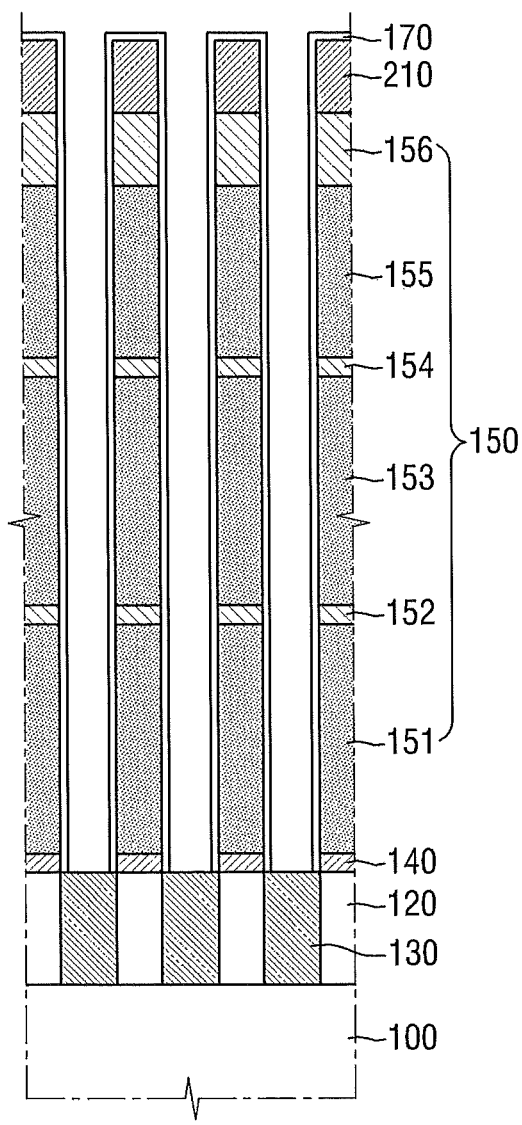
Figure 5:
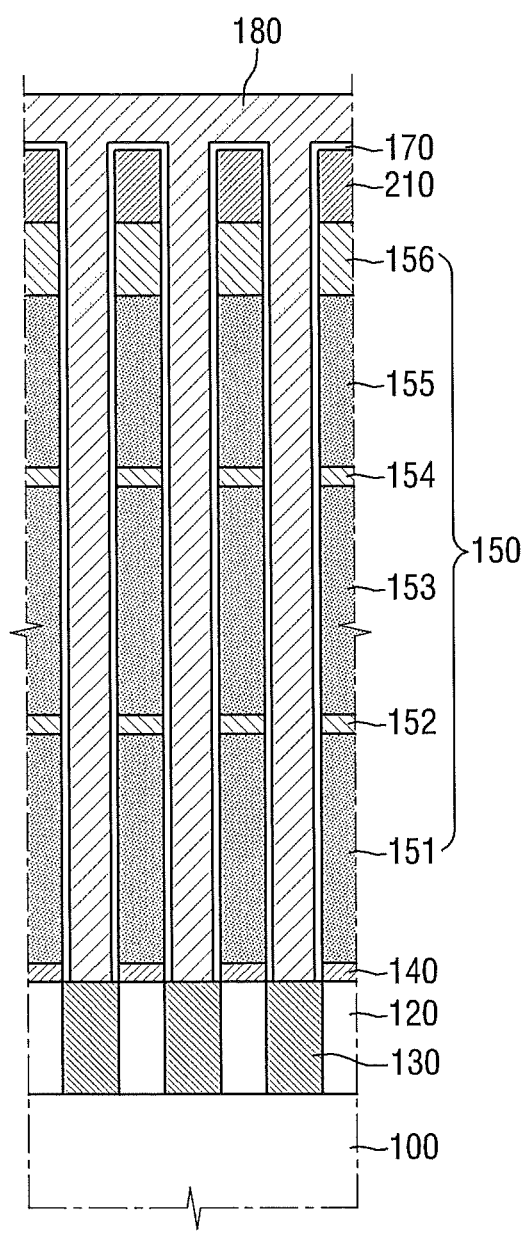

Referring now to FIGS. 1, 4, and 5, a lower electrode 180 is formed within the plurality of openings 160 (S130). Referring to FIG. 4, before forming the lower electrode 180, a silicide prevention layer 170 may be formed on an inner wall of each of the plurality of openings 160. More specifically, the silicide prevention layer 170 may be conformally formed along an inner wall of the opening 160 and limits or even prevents the reaction between materials of the first through nth sacrificial layers 151, 153, and 155 and the lower electrode (180 in FIG. 5). For the silicide prevention layer 170, a metal oxide layer, a metal nitride layer, or a metal oxynitride layer may be deposited. Materials including titanium oxide ($Ti_xO_y$) may be used to form the silicide prevention layer 170. Non-limiting examples of the silicide prevention layer 170 may include titanium oxide, titanium oxynitride, tantalum oxide, tantalum nitride, tantalum oxynitride, and so on. In some embodiments, a silicon oxide layer, a silicon nitride layer or a silicon oxynitride layer may be formed on inner walls of the openings 160 as a silicide prevention layer by performing an oxidation process or a nitridation process on the composite layer having the plurality of openings 160.

As shown in FIG. 4, the silicide prevention layer 170 formed on a bottom surface of each of the plurality of openings 160 may be selectively removed. For example, an etch back process may be performed to expose the contact plug 130 to the bottom surface of the opening 160.

Referring to FIG. 5, the lower electrode 180 is then formed so as to fill the plurality of openings 160. The lower electrode 180 may be formed of a conductive material such as titanium nitride (TiN) but is not limited thereto. Furthermore, in order to suppress the formation of silicide between a sidewall of a silicon-based sacrificial layer and the lower electrode 180, the lower electrode 180 may be deposited at low temperature (e.g., below about 500° C.). In some embodiments, when the lower electrode 180 is formed in a low temperature process, the formation of the silicide prevention layer 170 may be skipped.

Before forming the lower electrode 180, a barrier layer may be formed on bottom surfaces of the plurality of openings 160. More specifically, a metal layer, for example, a titanium layer, may be deposited on the bottom surfaces of the plurality of openings 160, thereby reducing resistance between the contact plug 130 and the lower electrode 180.

Figure 6:
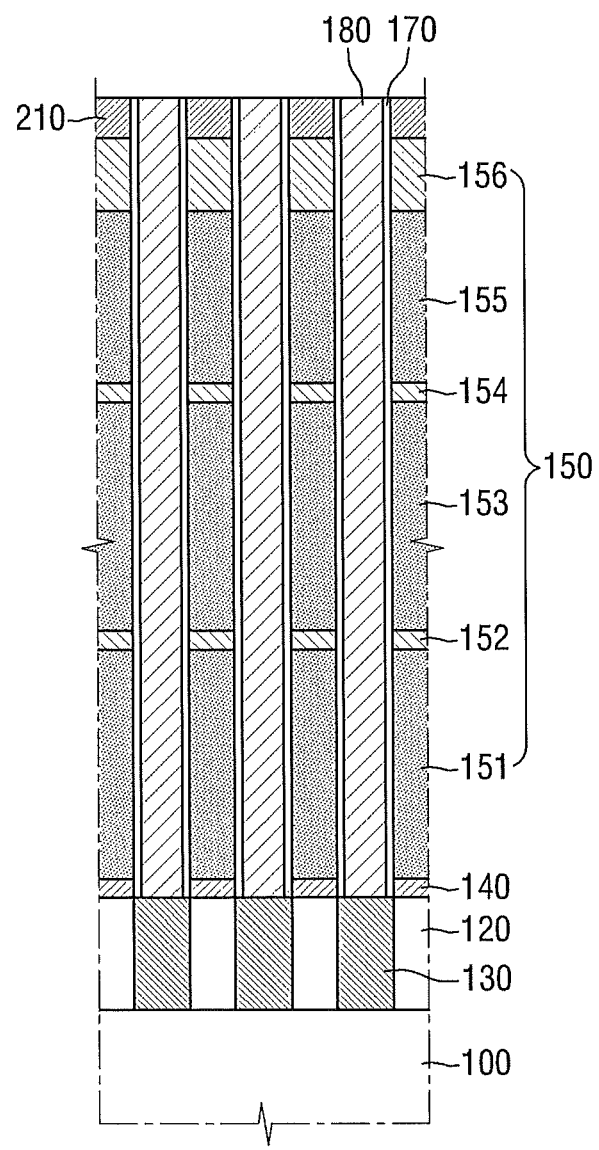

Referring to FIGS. 1 and 6 through 12, portions of the supporting layers 152, 154, and 156 and the whole of the sacrificial layers 151, 153, and 155 are removed (S140). Referring to FIG. 6, a portion of the lower electrode 180 is removed so as to separate the lower electrode 180 into a plurality of node electrodes. For example, a portion of the lower electrode 180 may be removed by CMP or etch back. Accordingly, the first mask pattern 210 may be exposed.

Figure 7:
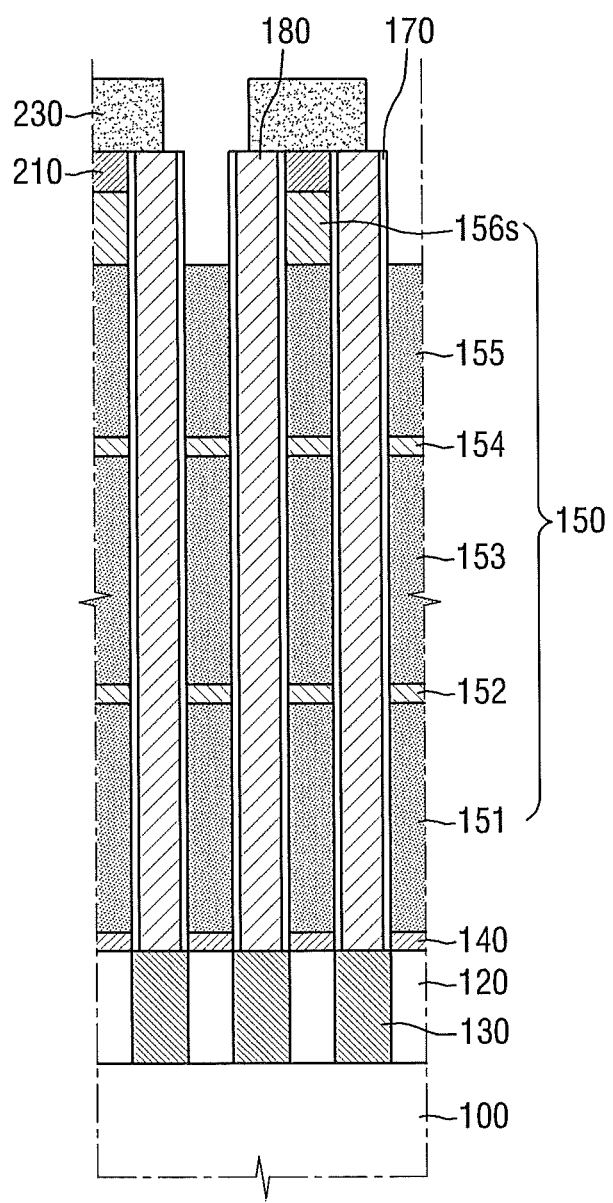

Thereafter, referring to FIG. 7, a second mask pattern 230 is formed, and portions of the first mask pattern 210 and the third supporting layer 156 are removed to expose a portion of the third sacrificial layer 155. In more detail, the second mask pattern 230 is formed on the first mask pattern 210 and the lower electrode 180 so as to expose a portion of the first mask pattern 210. The second mask pattern 230 may be a carbon mask pattern.

In order to expose a portion of the first mask pattern 210, the second mask pattern 230 includes an open region for exposing a portion of the first mask pattern 210 and a block region for blocking the remaining portion of the first mask pattern 210. In this case, portions of the first through the third supporting layers 152, 154, and 156 underlying the open region of the second mask pattern 230 are removed during a subsequent etching process. On the other hand, the remaining portions of the first through the third supporting layers 152, 154, and 156 underlying the block region of the second mask pattern 230 remain intact during the subsequent etching process to create a plurality of supports 152s, 154s, and 156s. Thereafter, portions of the first mask pattern 210 and the third supporting layer 156 are removed using the second mask pattern 230 as an etch mask so as to expose a portion of the third sacrificial layer 155.

Specifically, etching is performed using the second mask pattern 230 as an etch mask to remove portions exposed by the open region of the second mask pattern 230, that is, a portion of the first mask pattern 210 and a portion of the third supporting layer 156. Accordingly, a portion of the third sacrificial layer 155 may be exposed. It will be understood that exposing the portion of the third sacrificial layer 155 is referred to as exposing a region corresponding to the open region of the second mask pattern 230. The etching process may be a dry etching process, specifically an anisotropic etching process.

Figure 8:
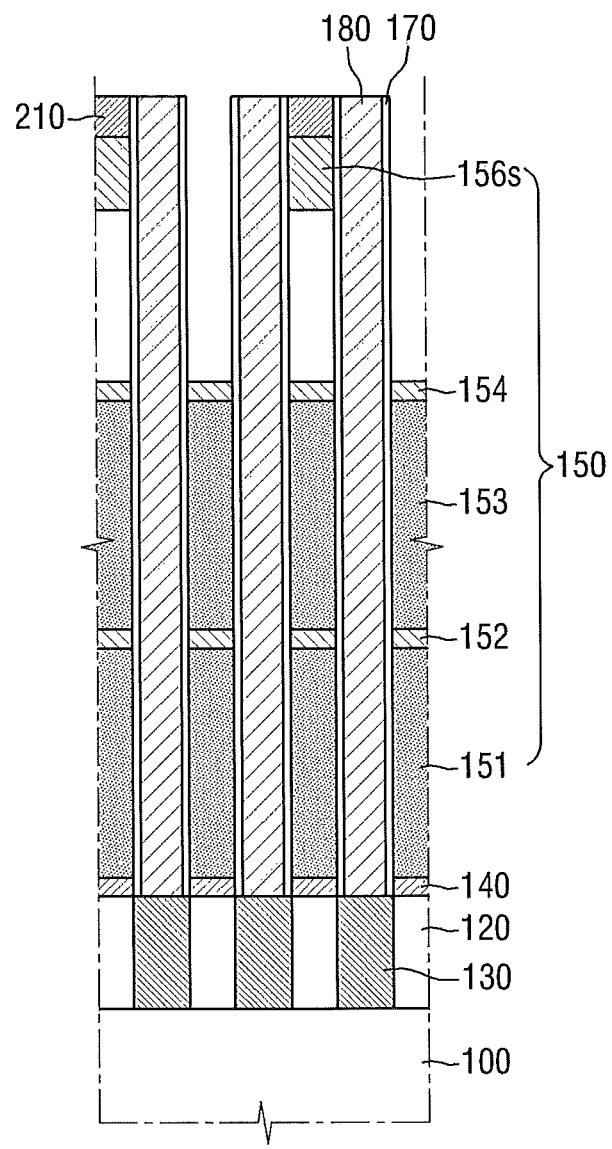

Referring to FIG. 8, through its exposed portion, the whole of the third sacrificial layer 155 may be removed. In more detail, wet etching may be performed to remove the whole of the third sacrificial layer 155. An etching solution with high selectivity of the third sacrificial layer 155 with respect to the third support 156s, the second support layer 154, and the first mask pattern 210 may be used during the wet etching. Although a region of the composite layer 150 with the third support 156s has been shown to be spatially separated from a region of the composite layer 150 without the third support 156s by the lower electrode 180, regions other than those having the plurality of openings 160 formed therein are interconnected with each other. Thus, the whole of the third sacrificial layer 155 may be removed by wet etching a portion of the third sacrificial layer 155 exposed by the first mask pattern 210 as well as the remaining portion of the third sacrificial layer 155 that is not exposed by the first mask pattern 210 but is connected with the exposed portion. In other words, the whole of the third sacrificial layer 155 may be optionally removed using wet etching. Referring to FIG. 8, before the removing of the whole of the third sacrificial layer 155, the second mask pattern (230 in FIG. 7) may be removed.

Figure 9:
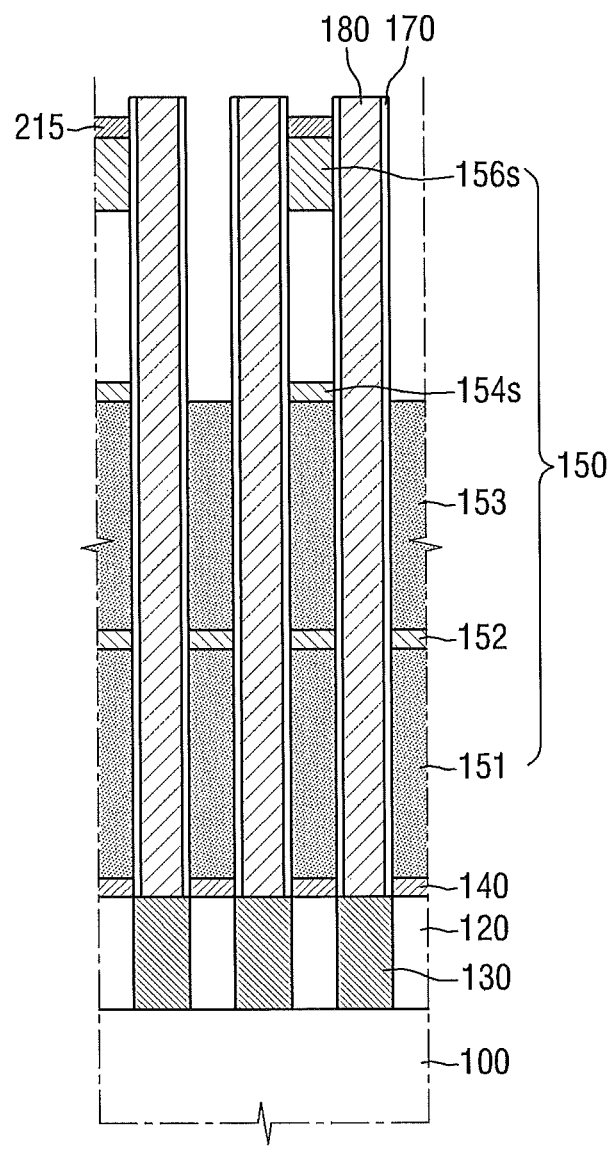

Subsequently, referring to FIG. 9, a portion of the second supporting layer 154 is removed using the first mask pattern 210 as an etch mask so as to expose a portion of the second sacrificial layer 153. In this case, a portion of the first mask pattern 210 is removed as well.

As described above, when the supporting layers (152, 154, and 156 in FIG. 2) contain the same material as the first mask pattern 210, the portion of the first mask pattern 210 may be removed together along with the portion of the second supporting layer 154. Thus, a thickness of the first mask pattern 215 shown in FIG. 9 is reduced compared to a thickness of the first mask pattern (210 in FIG. 8) before etching. The portion of the second supporting layer 154 may be removed in substantially the same manner as used in removing the portion of the nth supporting layer 156. By removing the portion of the second supporting layer 154, the second support 154s may be formed below the nth support 156s.

Figure 10:
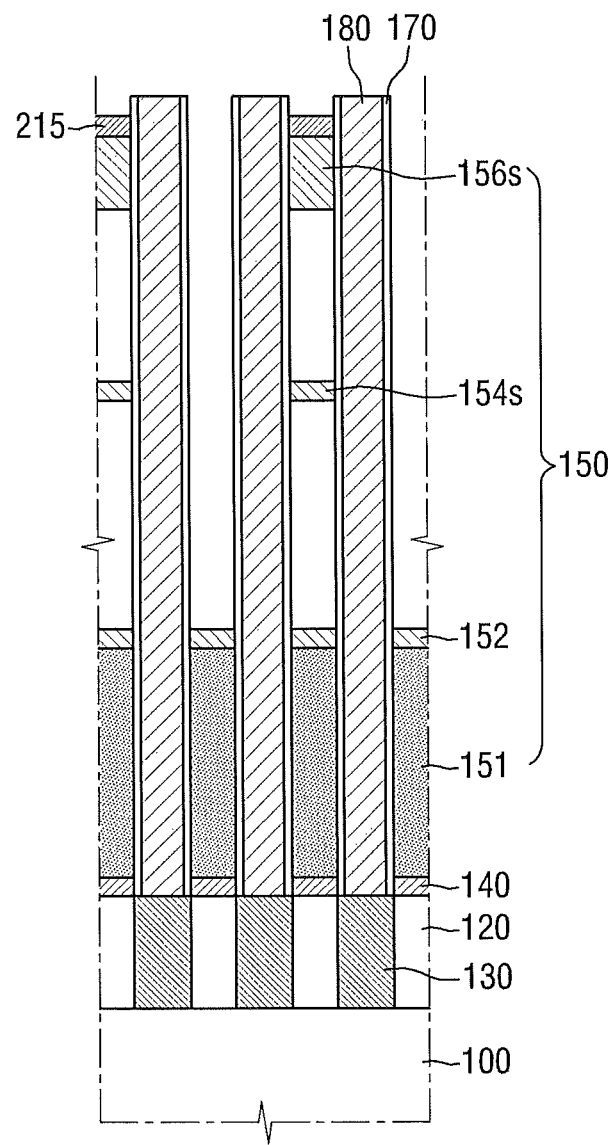

Referring to FIG. 10, through its exposed portion, the whole of the second sacrificial layer 153 may be removed. In more detail, wet etching may be performed to remove the whole of the second sacrificial layer 153 exposed by the first mask pattern 210 and the nth support 156s. The whole of the second sacrificial layer 153 is removed in substantially the same manner as used in removing the whole of the third sacrificial layer 155 as described above.

Figure 11:
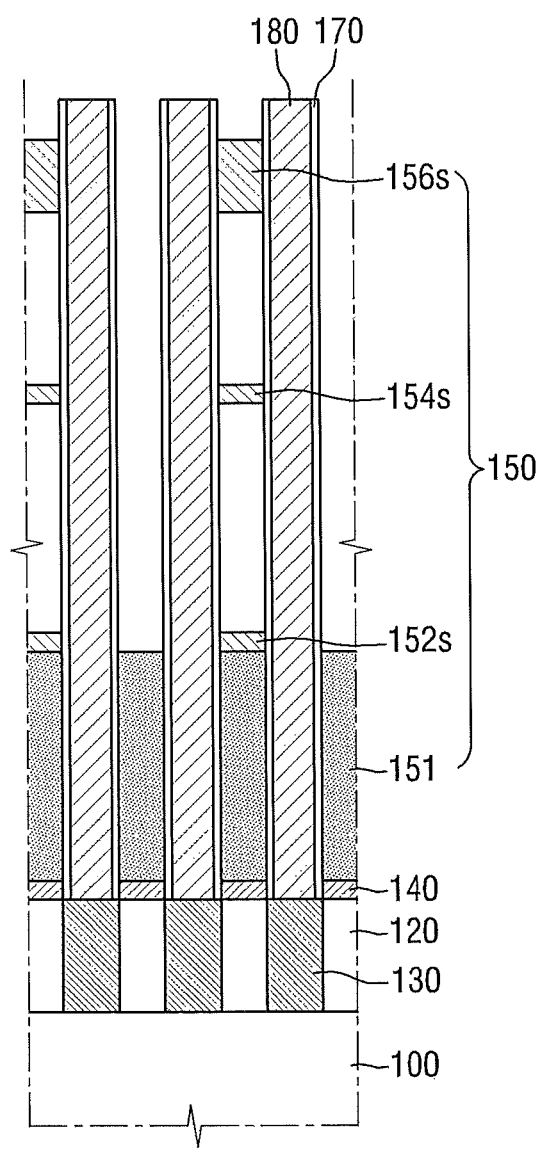

Referring to FIG. 11, a portion of the first supporting layer 152 is then removed using the first mask pattern 210 and the nth support 156s as etch masks, so as to expose a portion of the first sacrificial layer 151. As described with reference to FIG. 9, the first mask pattern 210 may be removed together with the supporting layers 152, 154, and 156. As shown in FIG. 11, the first mask pattern 210 are completely removed as the plurality of the supporting layers 152, 154, and 156 are removed in reverse order. In this case, the nth support 156s may be used as an etch mask. As described above, the composite layer 150 may include at least three supporting layers and sacrificial layers. Thus, when portions of the first through n supporting layers 152, 154, and 156 are etched using the first mask pattern 210 as an etch mask, the whole of the first mask pattern 210 may be removed before etching a portion of the first supporting layer 152.

Because FIGS. 2 through 11 show the composite layer 150 includes 3 supporting layers 152, 154, and 156, the first mask pattern 210 may be completely removed prior to etching of the first supporting layer 152. However, when the number of the supporting layers is greater than 3, the first mask pattern 210 may be completely removed before etching of a second, third, or fourth supporting layer. In this case, the supporting layers may be etched using the nth (third) support 156s as an etch mask.

Because the nth support 156s is used as an etch mask during etching of a portion of the lowermost first supporting layer 152, a thickness of the nth support 156s may be reduced. To compensate for the thickness reduction, the third supporting layer 156 that acts as an etch mask may be made thicker than any one of the first through (n−1)th supporting layers 152 and 154.

Figure 12:
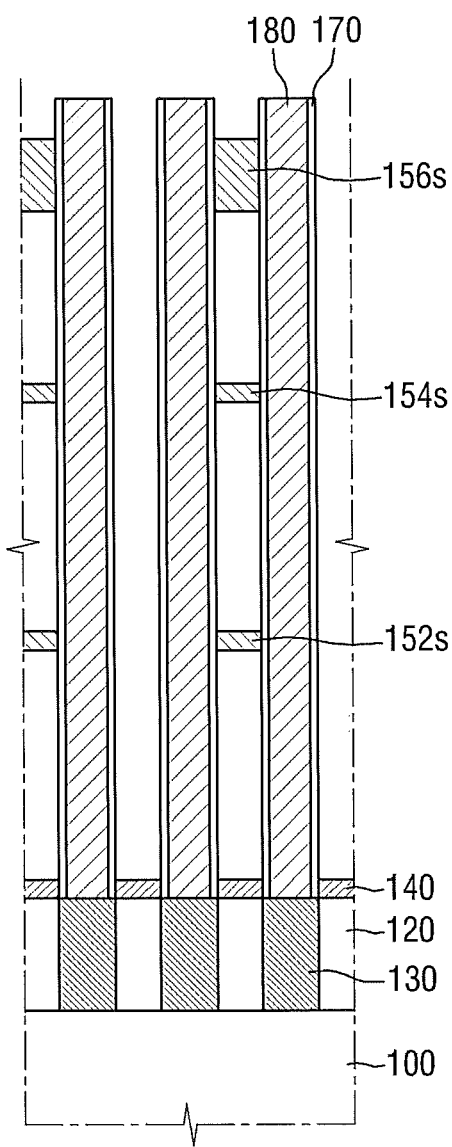

Referring to FIG. 12, the first sacrificial layer 151 is completely removed through its exposed portion. In more detail, wet etching is performed to completely remove the first sacrificial layer 151 exposed by the first support 152s. The whole of the first sacrificial layer 151 is removed in substantially the same manner as described above.

For example, removing portions of the first through nth supporting layers 152, 154, and 156 and the whole of the first through nth sacrificial layers 151, 153, and 155 may include (a) removing a portion of a kth supporting layer (k is a natural number descending sequentially from n to 1) to expose a portion of the kth sacrificial layer, (b) completely removing the kth sacrificial layer through its exposed portion, and (c) repeatedly performing the operation (b) to form the plurality of supports 152s, 154s, and 156s for supporting the lower electrode 180.

Figure 13:
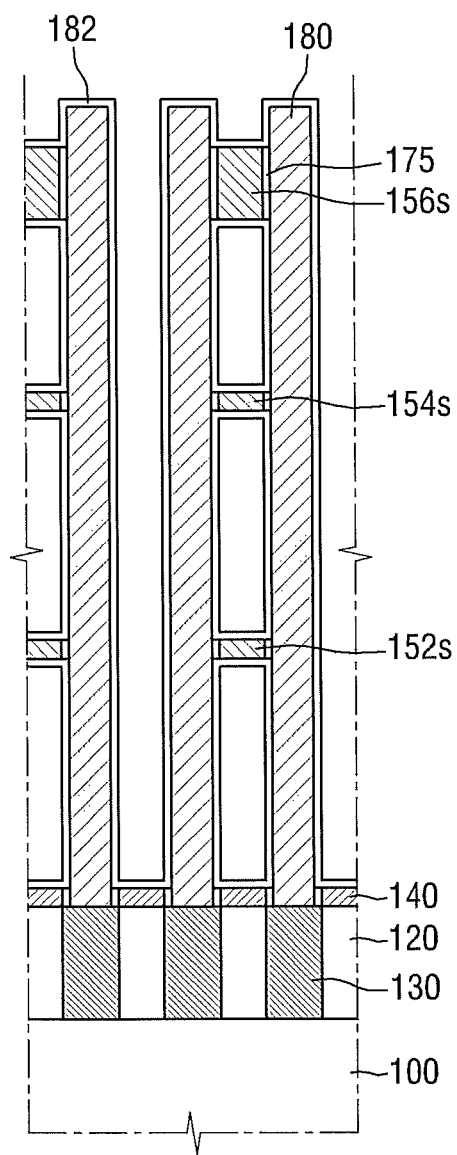
Figure 14:
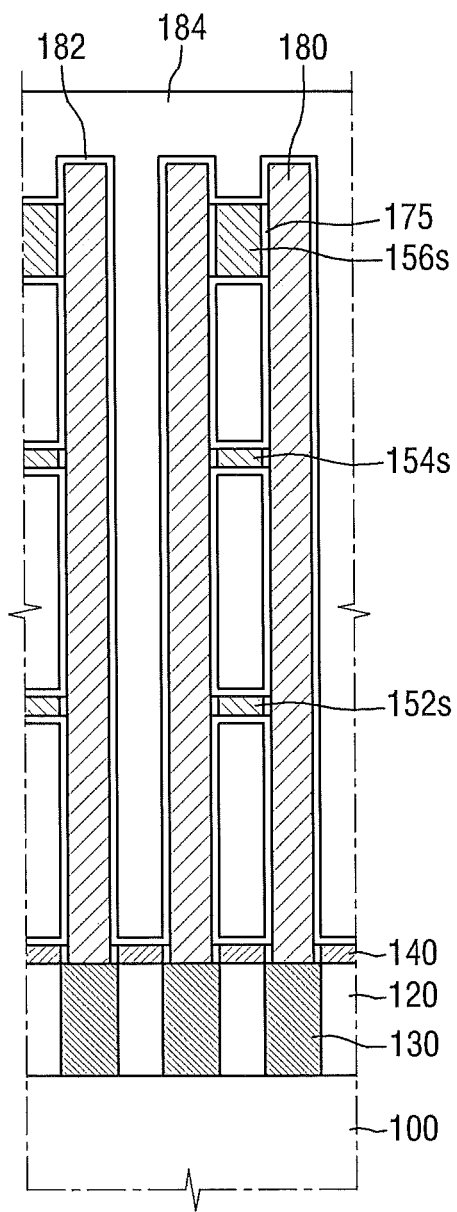

Referring to FIGS. 1, 13, and 14, a dielectric layer 182 and an upper electrode 184 are then formed (S150). Referring to FIG. 13, the dielectric layer 182 is formed on the lower electrode 180. More specifically, the dielectric layer 182 may be formed along the lower electrode 180 and the plurality of supports 152s, 154s, and 156s. For example, the dielectric layer 182 may be formed of, but not limited to, a single layer made of tantalum oxide ($Ta_2O_5$) or an aluminum oxide ($Al_2O_3$), or a stacked layer of tantalum oxide/titanium oxide or aluminum oxide/titanium oxide.

As shown in FIG. 13, the silicide prevention layer 170 is removed before forming the dielectric layer 182. For example, cleaning is performed using a low ammoniumfluoride liquid (LAL) or hydrofluoric acid (HF) solution to remove the silicide prevention layer 170 formed along a sidewall of the lower electrode 180. In this case, a portion 175 of the silicide prevention layer 170 formed between each of the plurality of supports 152s, 154s, and 156s and the lower electrode 180 may be left even after removing the other portion of the silicide prevention layer 170 because the plurality of supports 152s, 154s, and 156s are used as etch masks. In other words, the silicide prevention layer 170 may remain between each of the plurality of supports 152s, 154s, and 156s and the lower electrode 180.

Subsequently, referring to FIG. 14, the upper electrode 184 is formed on the dielectric layer 182 using the same conductive material as or a different material than the lower electrode 180.

Figure 15:
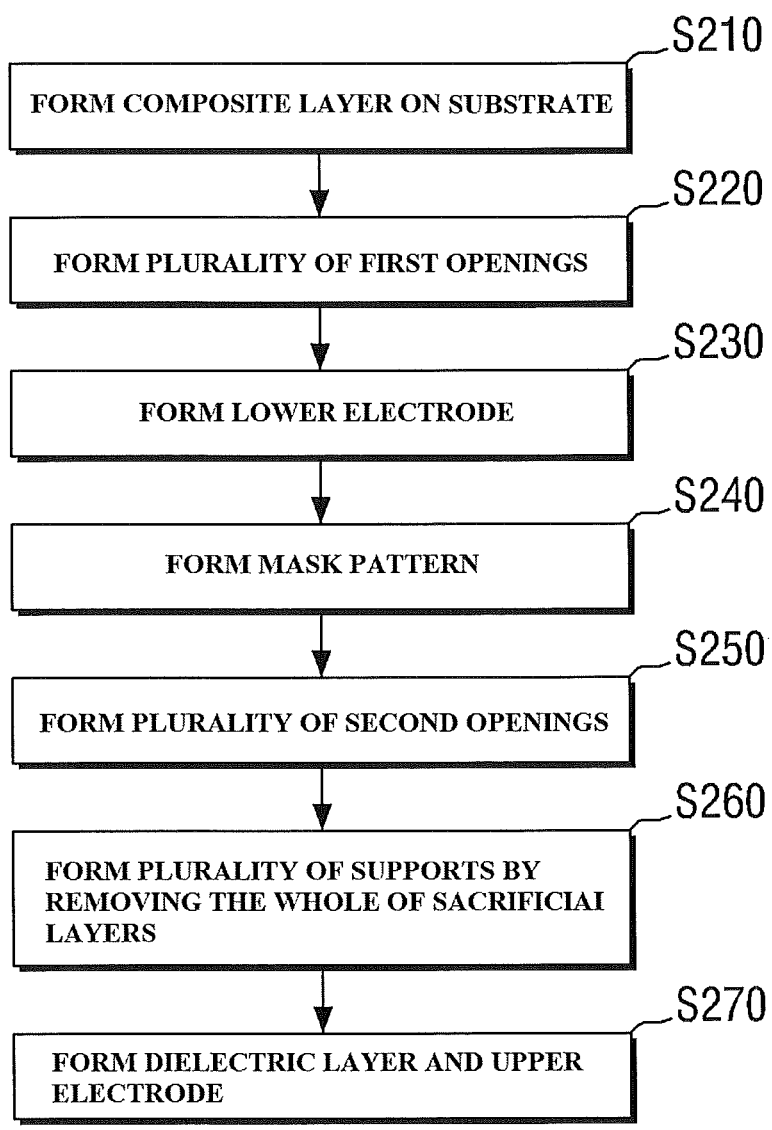
FIG. 15 is a flowchart illustrating a method of manufacturing a semiconductor device according to further embodiments of the present invention.
Figure 16:
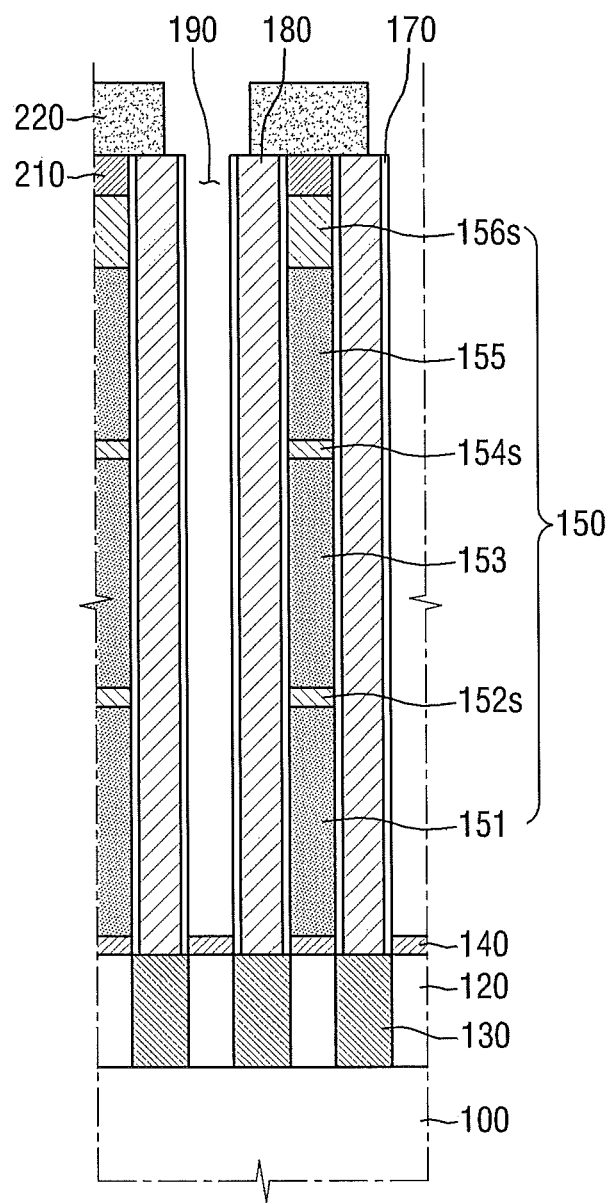
FIGS. 16 through 18 are cross-sectional views of intermediate structures illustrating the method of manufacturing a semiconductor device shown in FIG. 15 according to some embodiments of the present invention.
Figure 17:
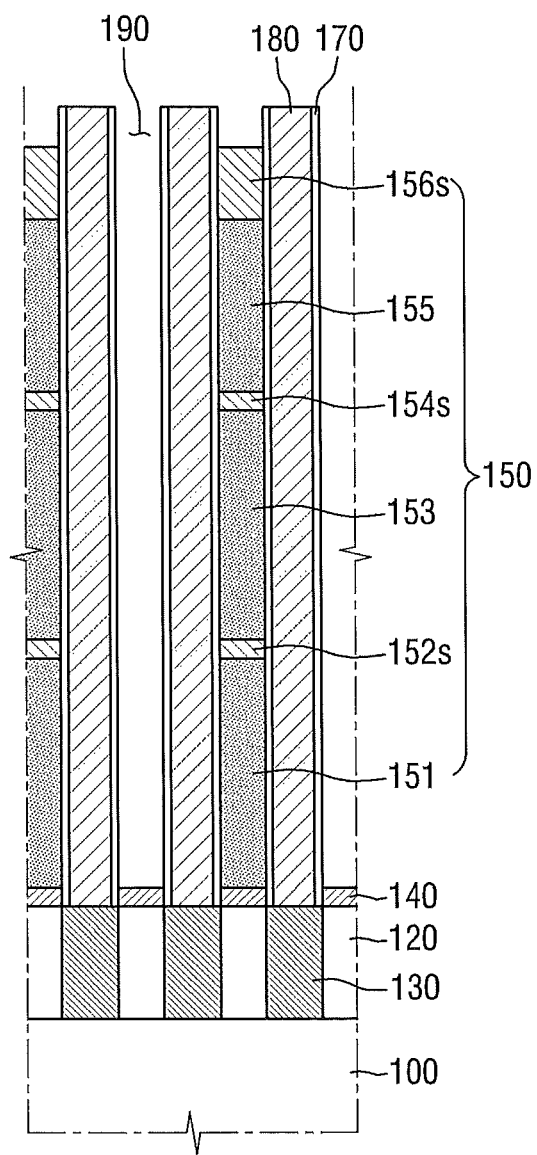
Figure 18:
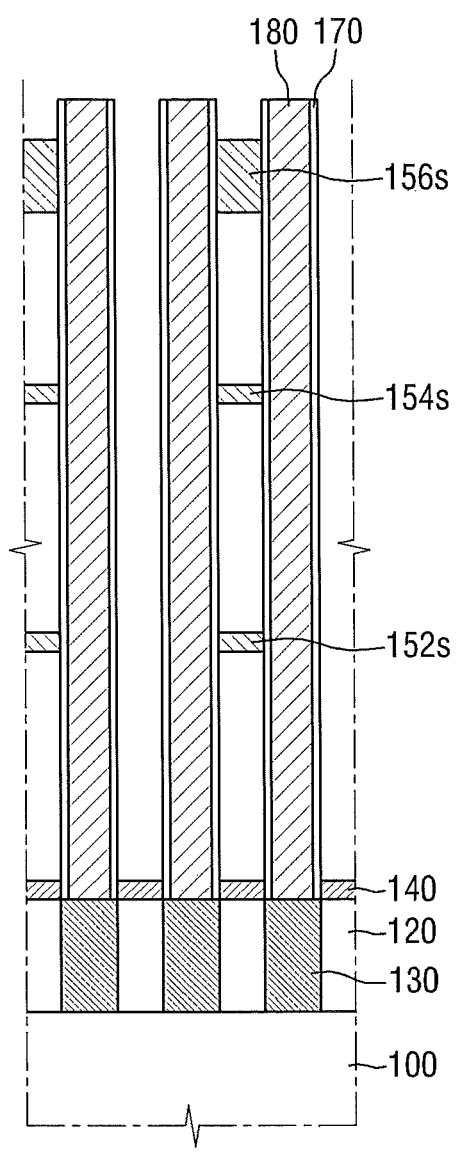

A method of manufacturing a semiconductor device according to other embodiments of the present invention will now be described with reference to FIGS. 15 through 18. FIG. 15 is a flowchart of a method of manufacturing a semiconductor device according to a other embodiments of the present invention, and FIGS. 16 through 18 are cross-sectional views of intermediate structures illustrating the method of manufacturing a semiconductor device shown in FIG. 15 according to some embodiments.

The method of manufacturing a semiconductor device according to the present embodiment is different from the previous embodiment in that a plurality of second openings for exposing first through nth sacrificial layers are formed so as to simultaneously remove the first through nth sacrificial layers in addition to forming a plurality of first openings for forming a lower electrode. For brevity of explanation, substantially the same components as those of the previous embodiment will not be described in detail or will be briefly described.

Referring to FIGS. 2 through 6 and 15, first, a composite layer 150 is formed on a substrate 100 (S210), a plurality of first openings 160 are formed (S220), and a lower electrode 180 is disposed in the plurality of first openings 160 (S230).

Like in the previous embodiments, the method includes forming the composite layer 150 by sequentially stacking on the substrate 100 alternate layers of first through nth sacrificial layers 151, 153, and 155 and first through nth supporting layers 152, 154, and 156, forming the plurality of first openings 160 so as to penetrate the composite layer 150, and forming the lower electrode 180 in the plurality of first openings 160. In other words, the first through nth sacrificial layers 151, 153, and 155 may contain a silicon-based material. For example, the first through nth sacrificial layers 151, 153, and 155 may include a silicon-based conductive material while the first through nth supporting layers 152, 154, and 156 may include an insulating material.

Thereafter, referring to FIGS. 15 and 16, a mask pattern 220 is formed on the lower electrode 180 (S240), and a plurality of second openings 190 is formed (S250). More specifically, the mask pattern 220 may be formed on the lower electrode 180 including an open region and a block region. In this case, the mask pattern 220 may be a carbon mask pattern. The open region of the mask pattern 220 may expose a portion of the lower electrode 180 and some of regions between the lower electrodes 180. As described above with reference to FIG. 7, portions of the first through nth supporting layers 152, 154, and 156 underlying the open region of the mask pattern 220 are removed during a subsequent etching process. On the other hand, the remaining portions of the first through nth supporting layers 152, 154, and 156 underlying the block region of the second mask pattern 230 remain intact during the subsequent etching process to create a plurality of supports 152s, 154s, and 156s.

As shown in FIG. 16, a portion of the composite layer 150 is etched using the mask pattern 220 as an etch mask so as to form the plurality of second openings 190 that penetrate the composite layer 150. In this case, portions of the first through nth sacrificial layers 151, 153, and 155 may be exposed by the plurality of the second openings 190. The plurality of second openings 190 may be formed between the lower electrodes 180 formed by burying the plurality of first openings (160 in FIG. 3).

Forming the plurality of second openings 190 may include sequentially etching a portion of the composite layer 150, i.e., portions of the first through nth supporting layers 152, 154, and 156 and the first through nth sacrificial layers 151, 153, and 155, corresponding to the open region of the mask pattern 220. In more detail, the nth supporting layer 156 may be etched using the mask pattern 220 as an etch mask, together with a first mask pattern 210 for forming the plurality of first openings 160. In other words, portions of the first mask pattern 210 and the nth supporting layer 156 corresponding to the open region of the mask pattern 220 are etched. In this case, a hydrogen-containing gas may be used as an etching gas. The nth sacrificial layer 155 is then etched using the mask pattern 220 as an etch mask. A fluorine-based gas, a bromine-based gas, oxygen $O_2$, or inactive gas may be used as an etching gas. In the same manner, the second supporting layer 154, the second sacrificial layer 153, the first supporting layer 152, and the first sacrificial layer 151 may be removed in sequential order.

That is, the first through nth supporting layers 152, 154, and 156 and the first through nth sacrificial layers 151, 153, and 155 are sequentially etched in a manner that is substantially similar to the etching described with reference to FIG. 3. In this way, the portion of the composite layer 150, i.e., portions of the first through nth sacrificial layers 151, 153, and 155 and the first through nth supporting layers 152, 154, and 156 corresponding to the open region of the mask pattern 220, are etched so as to expose portions of the first through nth sacrificial layers 151, 153, and 155. In other words, a plurality of second openings 190 penetrating the composite layer 150 may be formed by etching the composite layer 150 using the mask pattern 220 as an etch mask. Accordingly, the portions of the first through nth sacrificial layers 151, 153, and 155 are exposed through sidewalls of the plurality of second openings 190. Here, portions of the first through nth supporting layers 152, 154, and 156 are also exposed through the sidewalls of the plurality of second openings 190. That is to say, the portion of the first through nth supporting layers 152, 154, and 156 are exposed using the mask pattern 220 as the etch mask by forming the plurality of second openings 190 penetrating the composite layer 150.

Thereafter, referring to FIGS. 15, 17, and 18, the whole of the first through nth sacrificial layers 151, 153, and 155 are removed to form the plurality of supports 152s, 154s, and 156s (S260). As shown in FIG. 17, the mask pattern (220 in FIG. 16) is then removed together with the first mask pattern (210 in FIG. 16).

As shown in FIG. 18, the whole of the first through nth sacrificial layers 151, 153, and 155 are removed to form the plurality of supports 152s, 154s, and 156s for supporting the lower electrode 180. In more detail, wet etching may be performed to completely remove the first through nth sacrificial layers 151, 153, and 155. As described above, the portions of the first through nth sacrificial layers 151, 153, and 155 may be exposed by the plurality of second openings 190, and through their exposed portions, the whole of the first through nth sacrificial layers 151, 153, and 155 may be removed. In this case, an etching solution with high selectivity of the first through nth sacrificial layers 151, 153, and 155 with respect to the plurality of supports 152s, 154s, and 156s may be used during the wet etching. Although a region of the composite layer 150 with the plurality of supports 152s, 154s, and 156s has been shown to be spatially separated from a region of the composite layer 150 without the plurality of supports 152s, 154s, and 156s by the lower electrode 180, regions other than those having the plurality of second openings 190 formed therein are interconnected with each other. In other words, FIGS. 16 through 18 are cross-sectional views including a plurality of hole patterns that are formed in the composite layer 150 having a multilayered structure. Thus, portions of the first through nth sacrificial layers 151, 153, and 155 containing the plurality of supports 152s, 154s, and 156s have been shown in the cross-sectional views to be spatially separated from those of the first through nth sacrificial layers 151, 153, and 155 without the plurality of supports 152s, 154s, and 156s by the lower electrode 180. However, when seen in the plan view of the composite layer 150, the first through nth sacrificial layers 151, 153, and 155 are interconnected with one another so as to form a single material layer.

Thus, the whole of the first through nth sacrificial layers 151, 153, and 155 may be removed by wet etching portions of the first through nth sacrificial layers 151, 153, and 155 exposed by the plurality of second openings 190 as well as the remaining portions thereof that are not exposed by the first through nth supporting layers 152, 154, and 156 but is connected with the exposed portions thereof. For example, a portion of the nth (e.g., third) sacrificial layer 155 may be exposed by sidewalls of the plurality of second openings 190, and wet etching may be performed to remove the whole of the third sacrificial layer 155 through the exposed portion thereof. In the same manner, a portion of the second sacrificial layer 153 may be exposed by sidewalls of the plurality of second openings 190, and wet etching may be performed to remove the whole of the second sacrificial layer 153 through the exposed portion thereof. Similarly, a portion of the first sacrificial layer 151 may be exposed by sidewalls of the plurality of second openings 190, and wet etching may be performed to remove the whole of the first sacrificial layer 151 through the exposed portion thereof. In other words, wet etching may be performed only once to simultaneously remove the first through third sacrificial layers 151, 153, and 155 in the embodiments of FIGS. 15-18.

As described above, the plurality of second openings 190 are formed so as to penetrate the composite layer 150 and expose portions of the first through third sacrificial layers 151, 153, and 155, followed by wet etching to simultaneously remove the first through third sacrificial layers 151, 153, and 155. According to some embodiments, wet etching can be performed once to simultaneously remove the first through third sacrificial layers 151, 153, and 155, thereby significantly simplifying the manufacturing process.

Next, referring to FIGS. 14 and 15, a dielectric layer 182 and an upper electrode 184 are formed (S270). As described above, the dielectric layer 180 is formed along the lower electrode 180 and the plurality of supports 152s, 154s, and 156s. The silicide prevention layer 170 may be removed before forming the dielectric layer 182. As shown in FIG. 14, a portion 175 of the silicide prevention layer 170 formed between each of the plurality of supports 152s, 154s, and 156s and the lower electrode 180 is left even after removing the other portion of the silicide prevention layer 170 because the plurality of supports 152s, 154s, and 156s are used as etch masks.

Subsequently, the upper electrode 184 is disposed on the dielectric layer 184. The upper electrode 184 may be formed of the same conductive material as or a different material than the lower electrode 180.

A method of manufacturing a semiconductor device according to further embodiments of the present invention will now be described with reference to FIGS. 19 through 24. FIGS. 19 through 24 are cross-sectional views of intermediate structures illustrating a method of manufacturing a semiconductor device according to further embodiments of the present invention.

The method according to these embodiments differs from the other embodiments described above in that the semiconductor device includes a cylindrical capacitor. For brevity of explanation, substantially the same components as those of the previous embodiment will not be described in detail or will be briefly described.

Figure 19:
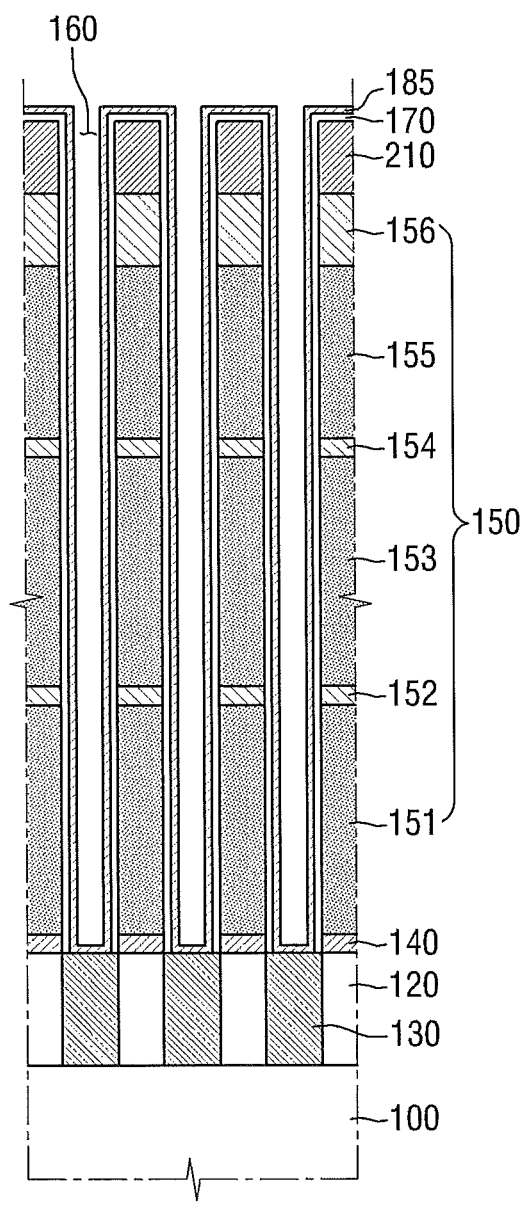
FIGS. 19 through 24 are cross-sectional views of intermediate structures illustrating a method of manufacturing a semiconductor device according to further embodiments of the present invention.
Figure 20:
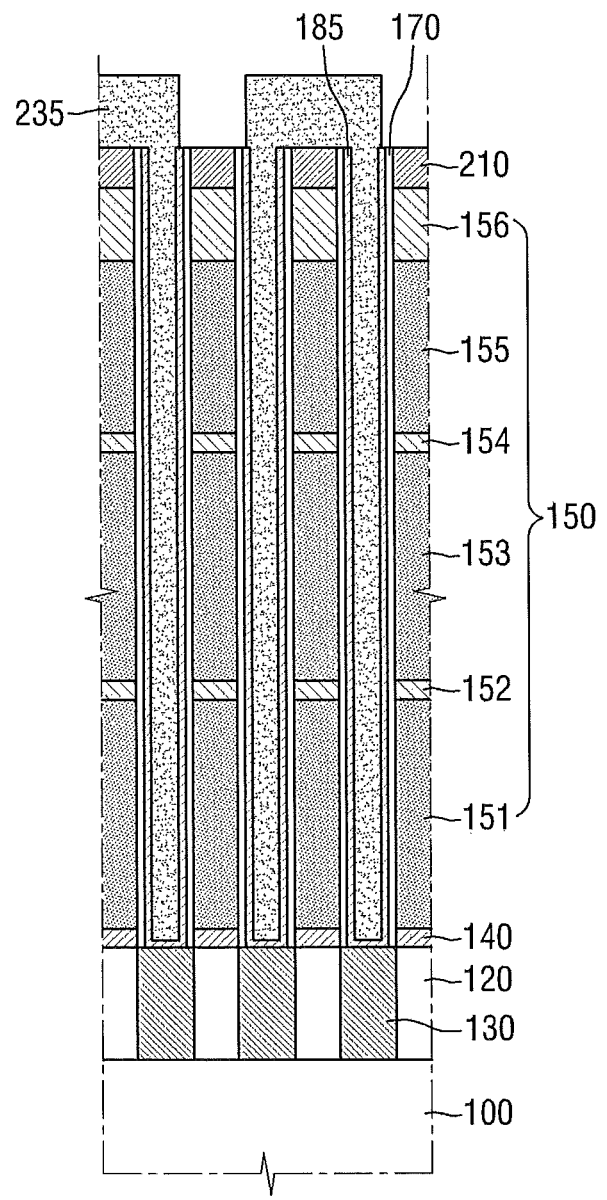
Figure 21:
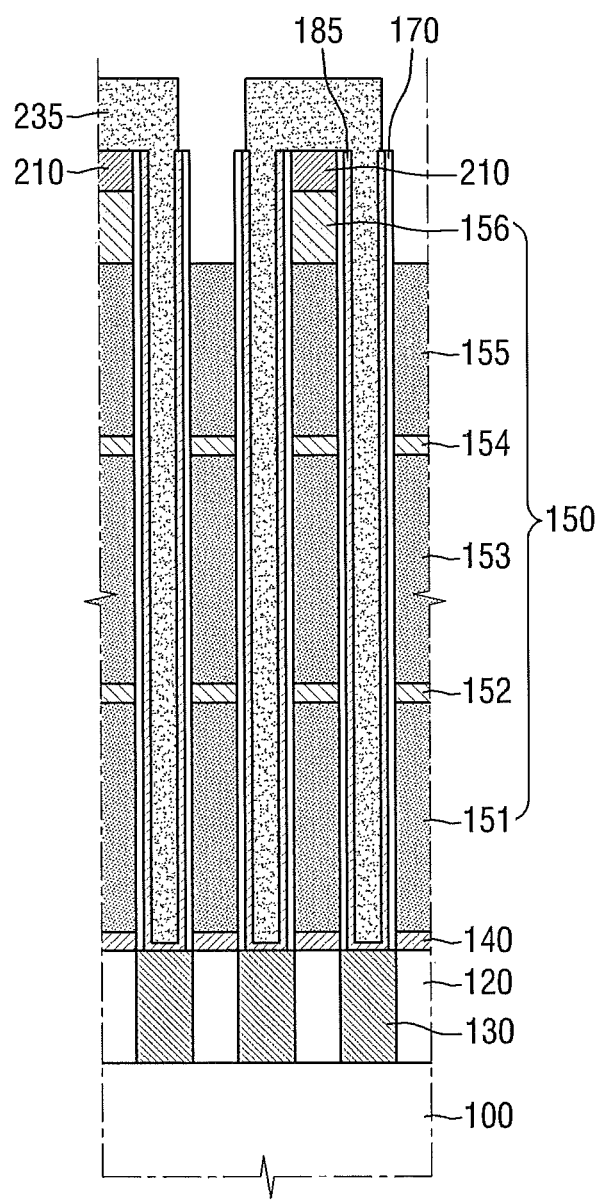
Figure 22:
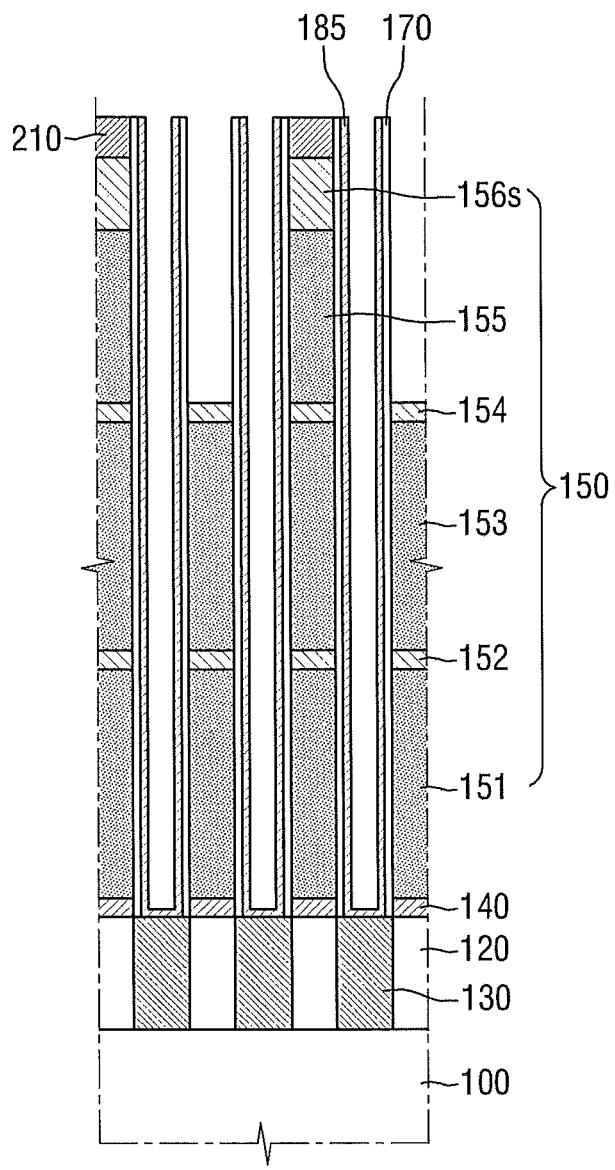
Figure 23:
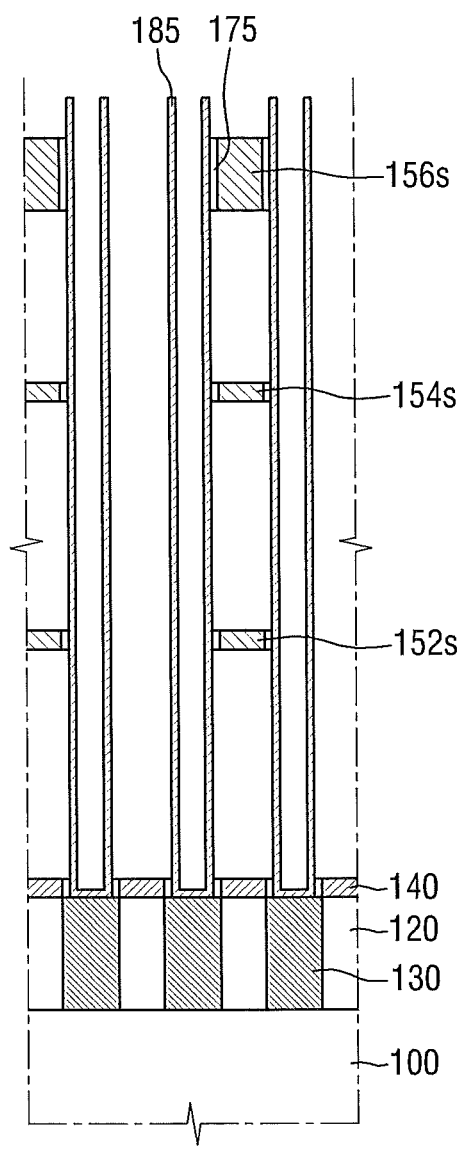
Figure 24:
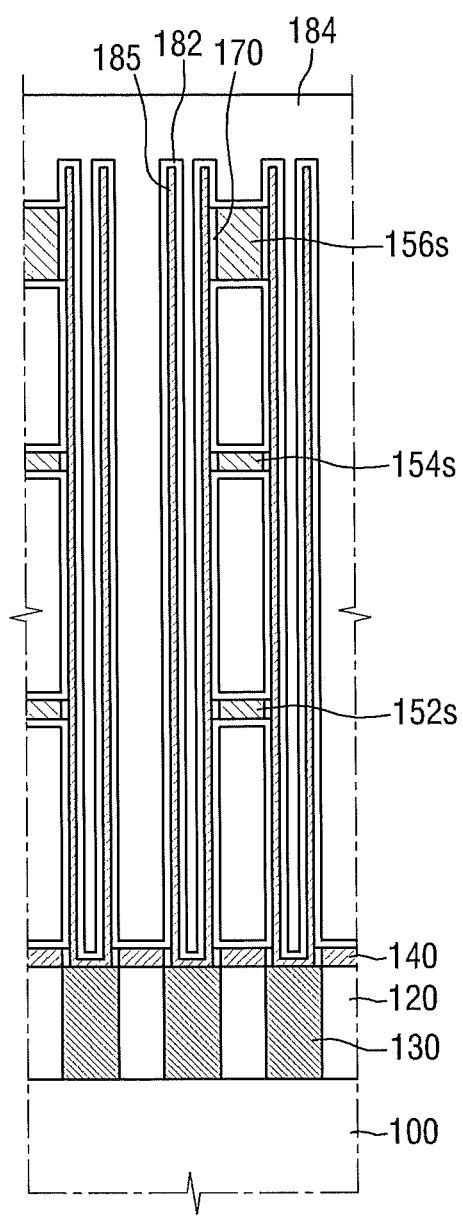

First, as shown in FIG. 19, a composite layer 150 is formed on a substrate 100, and a plurality of openings 160 is formed so as to penetrate the composite layer 150. A lower electrode 185 is formed in the plurality of openings 160 conformally. In more detail, a lower electrode 185 for forming a cylindrical capacitor is then formed by conformally depositing a lower electrode material in the plurality of openings 160.

Subsequently, referring to FIGS. 20 through 23, a second mask pattern 235 is formed and used as an etch mask to sequentially remove portions of a first mask pattern 210 and an nth supporting layer 156, the whole of the nth sacrificial layer 155 including the exposed portion, a portion of the second supporting layer 154, the whole of the second sacrificial layer 153, and a portion of the first supporting layer 154, and the whole of the first sacrificial layer 151. Because portions of the first through nth supporting layers 152, 154, and 156 and the whole of the first through nth sacrificial layers 151, 153, and 155 are sequentially removed in the same manner as described above in the first embodiment shown in FIGS. 6 through 12, a detailed description thereof will not be given. Thereafter, referring to FIG. 24, a dielectric layer 182 is formed along the lower electrode 185 and the plurality of supports 152s, 154s, and 156s, and an upper electrode 184 is deposited on the dielectric layer 182, thereby forming a cylindrical capacitor.

Figure 25:
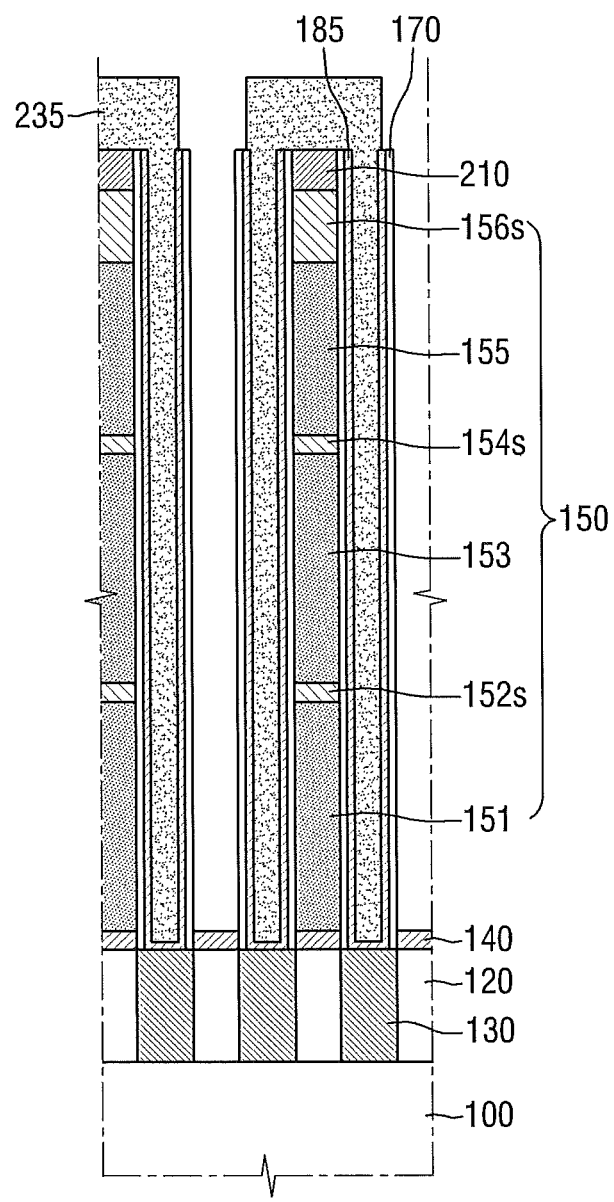
FIG. 25 is a cross-sectional view of an intermediate structure illustrating a method of manufacturing a semiconductor device according to other embodiments of the present invention.

A method of manufacturing a semiconductor device according to a yet other embodiments of the present invention will now be described with reference to FIG. 25. FIG. 25 is a cross-sectional view of an intermediate structure illustrating a method of manufacturing a semiconductor device according to yet other embodiments of the present invention.

The method according to these embodiments differs from the other embodiments described above in that a plurality of second openings for exposing portions of first through nth sacrificial layers are formed so as to simultaneously remove the first through nth sacrificial layers in addition to forming a plurality of first openings for forming a lower electrode, and the semiconductor device includes a cylindrical capacitor. For brevity of explanation, substantially the same components as those of the previous embodiment will not be described in detail or will be briefly described.

Referring to FIG. 25, in substantially the same manner as described with reference to FIG. 19, a composite layer 150 is formed on a substrate 100, and a plurality of first openings 160 is formed so as to penetrate the composite layer 150. A lower electrode 185 for forming a cylindrical capacitor is then formed by conformally depositing a lower electrode material in the plurality of first openings 160.

As shown in FIG. 25, a mask pattern 235 is then formed, followed by formation of a plurality of second openings 190. As described in the method with reference to FIG. 16, the mask pattern 235, such as a carbon mask pattern, including an open region and a block region is formed on the lower electrode 185. Subsequently, a plurality of second openings 190 are formed so as to penetrate the composite layer 150 and expose portions of the first through nth sacrificial layers 151, 153, and 155 using the mask pattern 235 as an etch mask. In other words, portions of the first through nth supporting layers 152, 154, and 156 and the first through nth sacrificial layers 151, 153, and 155 corresponding to an open region of the mask pattern 235 are sequentially etched to form the plurality of second openings 190 that penetrates the composite layer 150.

Thereafter, wet etching may be performed to completely remove the first through nth sacrificial layers 151, 153, and 155 exposed by the plurality of second openings 190. The wet etching process may be performed in substantially the same manner as described with reference to FIGS. 11 and 12. Thus, a detailed description thereof will not be given to avoid redundancy.

As described above, some embodiments of the present invention provide a method of manufacturing a semiconductor device that can provide enhanced reliability.

According to an aspect of some embodiments of the present invention, there is provided a method of manufacturing a semiconductor device, the method including forming a composite layer by sequentially stacking on a substrate alternating layers of first through nth sacrificial layers and first through nth supporting layers, forming a plurality of openings so as to penetrate the composite layer, forming a lower electrode in the plurality of openings, removing portions of the first through nth supporting layers and portions of or the whole of the first through nth sacrificial layers, and forming a dielectric layer and an upper electrode on the lower electrode, wherein the removing of the portions of the first through nth supporting layers and the portions of or the whole of the first through nth sacrificial layers include removing a portion of a kth supporting layer when k is a natural number descending sequentially from n to 1 to expose a portion of the kth sacrificial layer, completely removing the kth sacrificial layer through the exposed portion of the kth sacrificial layer, and forming a plurality of supports for supporting the lower electrode by repeatedly performing the removing of the portion of the kth supporting layer and the completely removing of the kth sacrificial layer at least twice.

According to another aspect of some embodiments of the present invention, there is provided a method of manufacturing a semiconductor device, the method including forming a composite layer by sequentially stacking on a substrate alternating layers of first through nth sacrificial layers and first through nth supporting layers, forming a plurality of first openings so as to penetrate the composite layer, forming a lower electrode in the plurality of first openings, forming a mask pattern on the lower electrode, forming a plurality of second openings penetrating the composite layer by etching a portion of the composite layer using the mask pattern as an etch mask and exposing portions of first through nth sacrificial layers, forming a plurality of supports for supporting the lower electrode by simultaneously removing the whole of the first through nth sacrificial layers exposed by the plurality of second openings, and forming a dielectric layer and an upper electrode on the lower electrode.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, the method comprising:
    providing a substrate;
    forming a composite layer, including sequentially stacking on the substrate alternating layers of first through nth sacrificial layers and first through nth supporting layers, where n is a natural number greater than 1, wherein the first supporting layer is stacked on the first sacrificial layer;
    forming a plurality of openings that penetrate the composite layer;
    forming a lower electrode in the plurality of openings;
    removing at least portions of the first through nth sacrificial layers to define a support structure for the lower electrode extending between adjacent ones of the plurality of openings and the lower electrode formed therein, the support structure including the first through nth supporting layers and a gap region between adjacent ones of the first through nth supporting layers where the first through nth sacrificial layers have been removed;
    forming a dielectric layer on the lower electrode; and
    forming an upper electrode on the dielectric layer,
    wherein forming a composite layer includes:
        forming one of the sacrificial layers;
        performing a hydrogen treatment on the formed one of the sacrificial layers that limits subsequent formation of a native oxide layer thereon;
        forming an adjacent one of the supporting layers on the hydrogen treated sacrificial layer; and
        repeating forming one of the sacrificial layers, performing a hydrogen treatment and forming an adjacent one of the supporting layers to provide the first through nth sacrificial layers and first through nth supporting layers.

2. The method of claim 1, wherein the first through nth sacrificial layers include a silicon (Si)-based material including Si—Si bonds having a low bonding energy relative to a material of the first through nth supporting layers and include a conductive material that reduces a charge effect during removing of the at least portions of the first through nth sacrificial layers.

3. The method of claim 2, wherein the first through nth sacrificial layers include at least one of crystalline silicon, polysilicon, amorphous silicon, and silicon germanium.

4. The method of claim 2, wherein the first through nth supporting layers include an insulating material.

5. The method of claim 4, wherein the first through nth supporting layers include at least one of a silicon nitride layer, a silicon oxide layer, or a silicon oxynitride layer.

6. The method of claim 1, wherein removing at least portions of the first through nth sacrificial layers includes removing a portion of the first through nth supporting layers.

7. The method of claim 1, wherein forming the lower electrode is preceded by forming a silicide prevention layer along an inner wall of each of the plurality of openings.

8. The method of claim 7, wherein the silicide prevention layer includes titanium oxide ($Ti_xO_y$).

9. The method of claim 1, wherein removing at least portions of the first through nth sacrificial layers comprises:
- removing a portion of a kth supporting layer, where k is a natural number descending sequentially from n to 1, to expose a portion of the kth sacrificial layer;
- substantially completely removing the kth sacrificial layer through the exposed portion of the kth sacrificial layer; and
- forming a plurality of supports of the support structure for supporting the lower electrode by repeatedly performing the removing of the portion of the kth supporting layer and the substantially completely removing of the kth sacrificial layer at least twice.

10. The method of claim 9, wherein the forming of the composite layer comprises forming the nth supporting layer to be thicker than any one of the first through (n−1)th supporting layers.

11. The method of claim 10, wherein the forming of the plurality of openings comprises forming a first mask pattern on the nth supporting layer and selectively etching the composite layer using the first mask pattern as an etch mask and wherein the removing of the portions of the first through nth supporting layers and the whole of the first through nth sacrificial layers comprises:
- forming a second mask pattern on the first mask pattern and the lower electrode that exposes a portion of the first mask pattern;
- removing the exposed portion of the first mask pattern and the nth supporting layer using the second mask pattern as an etch mask and exposing a portion of the nth sacrificial layer;
- removing the second mask pattern;
- wet etching the device to substantially completely remove the nth sacrificial layer;
- exposing a portion of the (n−1)th sacrificial layer by removing the (n−1)th supporting layer using the first mask pattern as an etch mask and removing a portion of the first mask pattern together with the (n−1)th supporting layer; and
- wet etching the device to substantially completely remove the (n−1)th sacrificial layer.

12. The method of claim 1, wherein forming the lower electrode comprises conformally forming a lower electrode material in the plurality of openings to define a lower electrode of a cylindrical capacitor.

13. The method of claim 1, wherein forming the plurality of openings comprises forming the plurality of openings concurrently in a same operation.

14. The method of claim 13, wherein forming of the plurality of openings comprises:
- forming a mask pattern on the composite layer; and
- etching the composite layer using the mask pattern as an etch mask to form the plurality of openings.

15. The method of claim 14, wherein removing at least portions of the first through nth sacrificial layers comprises:
- removing the mask pattern; and then
- wet etching the device to substantially completely remove the first through nth sacrificial layers using an etching solution with a high selectivity of the of the sacrificial layers relative to the support layers.

16. A method of manufacturing a semiconductor device, the method comprising:
- forming a composite layer by sequentially stacking on a substrate alternating layers of first through nth sacrificial layers and first through nth supporting layers, where n is a natural number greater than 1;
- forming a plurality of openings so as to penetrate the composite layer;
- forming a lower electrode in the plurality of openings;
- removing portions of the first through nth supporting layers and portions of or the whole of the first through nth sacrificial layers; and
- forming a dielectric layer and an upper electrode on the lower electrode,
- wherein the removing of the portions of the first through nth supporting layers and the portions of or the whole of the first through nth sacrificial layers comprises:
  - removing a portion of a kth supporting layer when k is a natural number descending sequentially from n to 1 to expose a portion of the kth sacrificial layer;
  - completely removing the kth sacrificial layer through the exposed portion of the kth sacrificial layer; and
  - forming a plurality of supports for supporting the lower electrode by repeatedly performing the removing of the portion of the kth supporting layer and the completely removing of the kth sacrificial layer at least twice,
- wherein forming a composite layer includes:
  - forming one of the sacrificial layers;
  - performing a hydrogen treatment on the formed one of the sacrificial layers that limits subsequent formation of a native oxide layer thereon:
  - forming an adjacent one of the supporting layers on the hydrogen treated sacrificial layer; and
  - repeating forming one of the sacrificial layers, performing a hydrogen treatment and forming an adjacent one of the supporting layers to provide the first through nth sacrificial layers and first through nth supporting layers.

17. A method of manufacturing a semiconductor device, the method comprising:
- forming a composite layer by sequentially stacking on a substrate alternating layers of first through nth sacrificial layers and first through nth supporting layers, where n is a natural number greater than 1;
- forming a plurality of first openings so as to penetrate the composite layer;
- forming a lower electrode in the plurality of first openings;
- forming a mask pattern on the lower electrode;
- forming a plurality of second openings penetrating the composite layer by etching a portion of the composite layer using the mask pattern as an etch mask and exposing portions of first through nth sacrificial layers;
- forming a plurality of supports for supporting the lower electrode by simultaneously removing the whole of the first through nth sacrificial layers exposed by the plurality of second openings; and
- forming a dielectric layer and an upper electrode on the lower electrode,
- wherein forming a composite layer includes:
  - forming one of the sacrificial layers;
  - performing a hydrogen treatment on the formed one of the sacrificial layers that limits subsequent formation of a native oxide layer thereon;
  - forming an adjacent one of the supporting layers on the hydrogen treated sacrificial layer; and
  - repeating forming one of the sacrificial layers, performing a hydrogen treatment and forming an adjacent one of the supporting layers to provide the first through nth sacrificial layers and first through nth supporting layers.

18. The method of claim 17, wherein the first through nth sacrificial layers contain a silicon-based material.

19. The method of claim 17, before forming the lower electrode, further comprising forming a silicide prevention layer along an inner wall of each of the plurality of openings, and the forming of the silicide prevention layer comprises forming a material containing titanium oxide ($Ti_xO_y$) along the inner walls of the plurality of openings.

* * * * *